(12) United States Patent
Hashimoto et al.

(10) Patent No.: US 9,849,535 B2
(45) Date of Patent: Dec. 26, 2017

(54) JET NOZZLE AND JET SOLDERING APPARATUS

(71) Applicant: Senju Metal Industry Co., Ltd., Tokyo (JP)

(72) Inventors: Noboru Hashimoto, Toyama (JP); Takahiro Kasama, Toyama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/260,678

(22) Filed: Sep. 9, 2016

(65) Prior Publication Data

US 2017/0072492 A1 Mar. 16, 2017

(30) Foreign Application Priority Data

Sep. 11, 2015 (JP) .................................. 2015-179350

(51) Int. Cl.
| | |
|---|---|
| *B23K 3/06* | (2006.01) |
| *B23K 1/00* | (2006.01) |
| *B23K 1/08* | (2006.01) |
| *H05K 3/34* | (2006.01) |
| *B23K 101/42* | (2006.01) |

(52) U.S. Cl.
CPC .......... *B23K 3/0653* (2013.01); *B23K 1/0016* (2013.01); *B23K 1/085* (2013.01); *B23K 3/0646* (2013.01); *B23K 3/0676* (2013.01); *H05K 3/34* (2013.01); *H05K 3/3468* (2013.01); *B23K 2201/42* (2013.01); *H05K 2203/1509* (2013.01)

(58) Field of Classification Search
CPC ... B23K 3/0653; B23K 1/085; B23K 2201/42

USPC ................ 228/37, 260, 180.1, 43
See application file for complete search history.

(56) References Cited

U.S. PATENT DOCUMENTS 4,447,001 A * 5/1984 Allen .................... B23K 3/0653
228/260
6,367,677 B1 * 4/2002 Hildenbrand .......... B23K 1/085
228/37

FOREIGN PATENT DOCUMENTS

| CN | 104684273 A | 6/2015 |
|---|---|---|
| JP | S52-122349 U | 9/1977 |
| JP | 06-000633 A | 1/1994 |
| JP | H07-41411 B2 | 5/1995 |
| JP | 200136226 A | 2/2001 |
| JP | 2002134898 A | 5/2002 |
| JP | 2002271012 A | 9/2002 |
| JP | 2006080439 A | 3/2006 |

(Continued)

*Primary Examiner* — Erin Saad
(74) *Attorney, Agent, or Firm* — The Webb Law Firm

(57) ABSTRACT

Provided is a jet nozzle that varies a width of a flow of jetted molten solder. The jet nozzle contains a nozzle main body having a channel section at its part and a molten solder flow width varying member that varies a width of the upper opening end of the nozzle main body by a slide of the molten solder flow width varying member within the channel section of the nozzle main body to vary a width of the molten solder flow jetted from the upper opening end of the nozzle main body. The molten solder flow width varying member includes a molten solder flow width varying plate that varies the width of the molten solder flow, a rectangular rectifying piece that extends along a slide direction of the molten solder flow width varying member, and a sliding shaft that slides the rectifying piece.

15 Claims, 10 Drawing Sheets

(56) References Cited

FOREIGN PATENT DOCUMENTS

JP          3910797 B2   2/2007
JP        201398467 A    5/2013

* cited by examiner

[FIG. 1]
Related Art
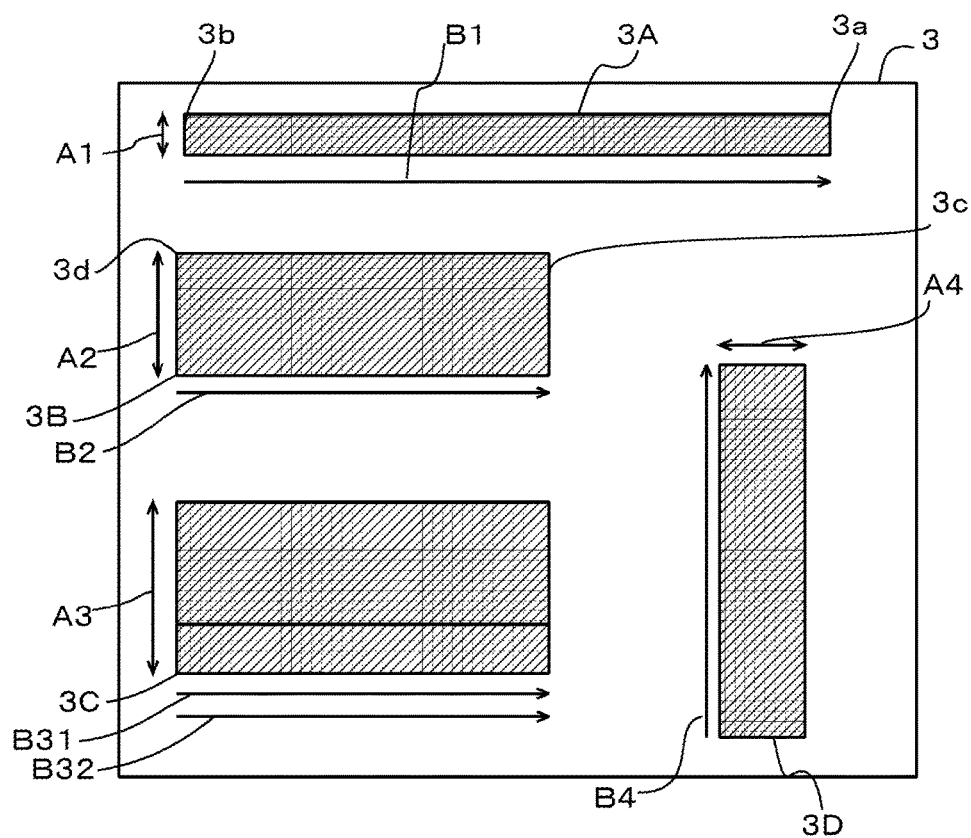

[FIG. 2]
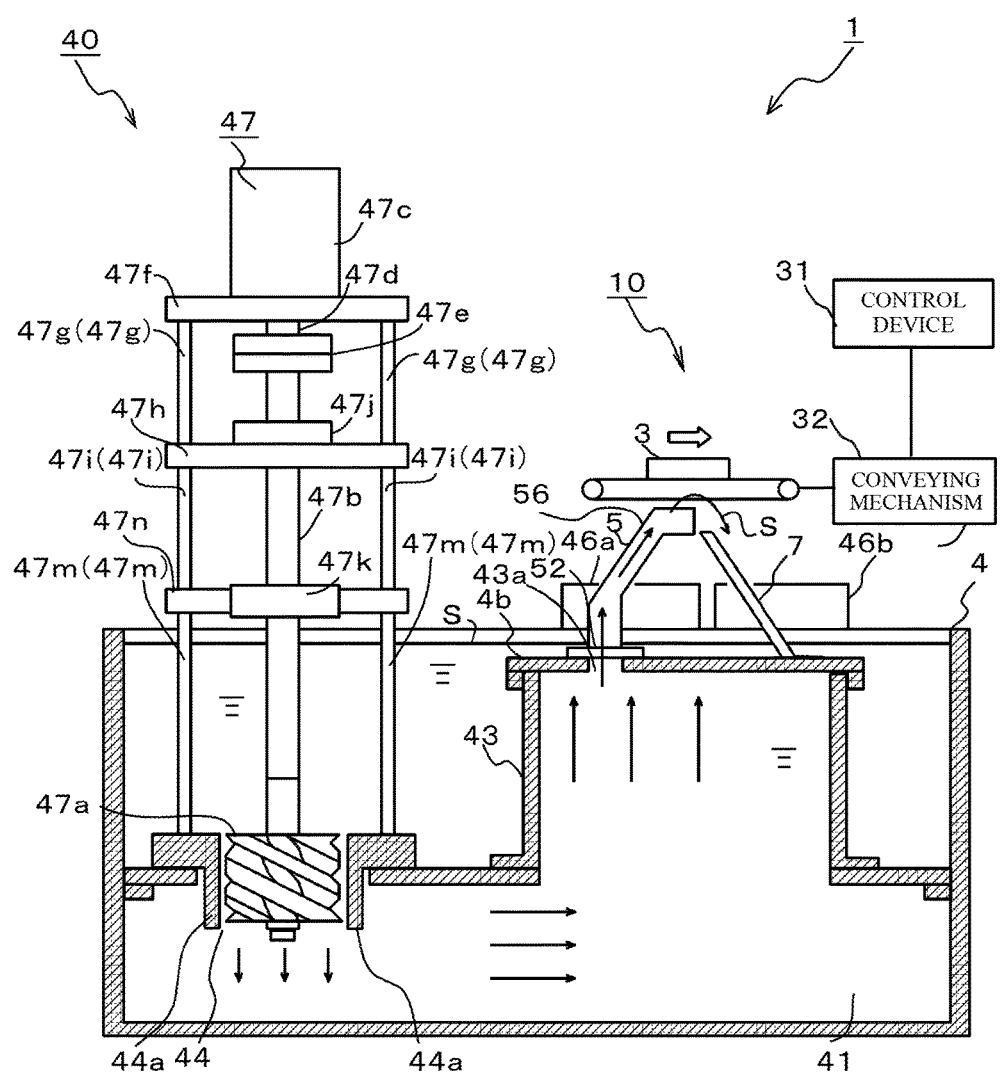

[FIG. 3]
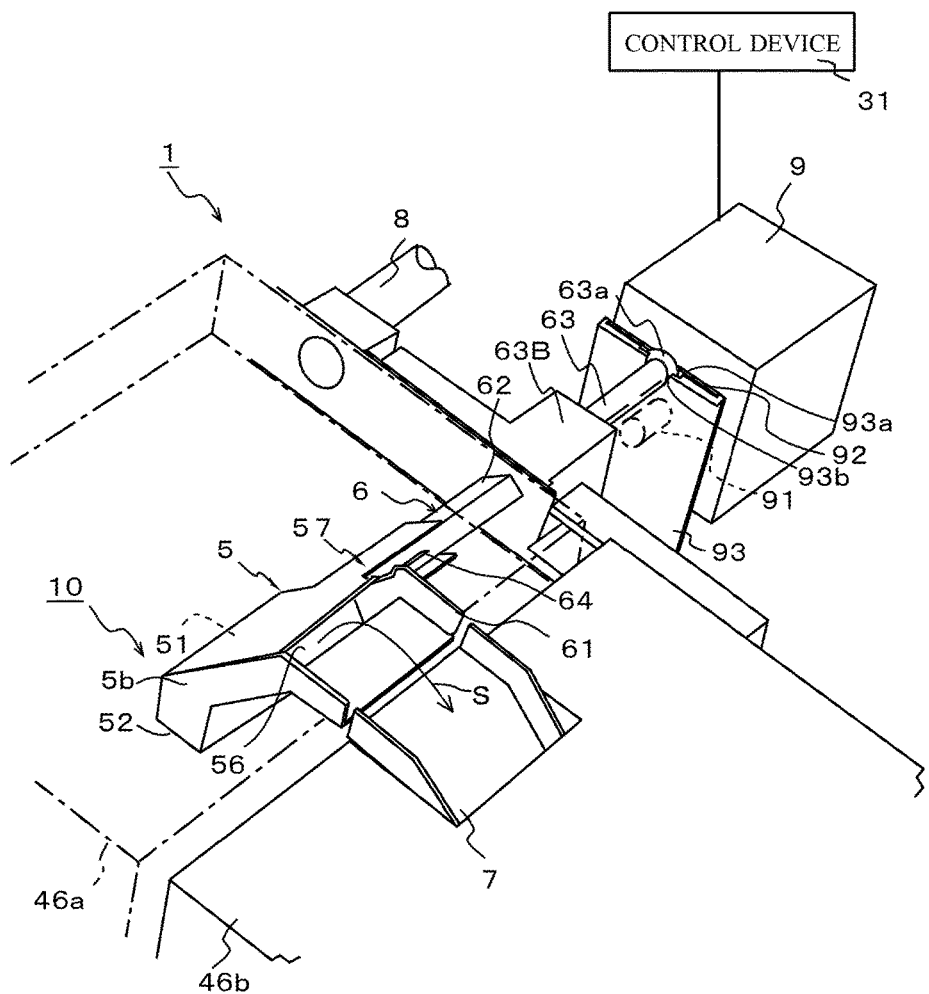

[FIG. 4A]
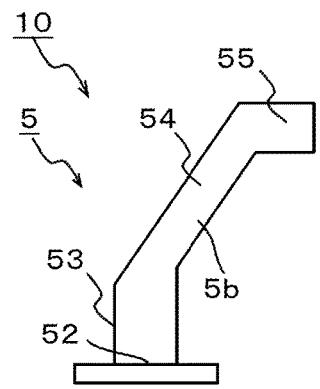
[FIG. 4B]
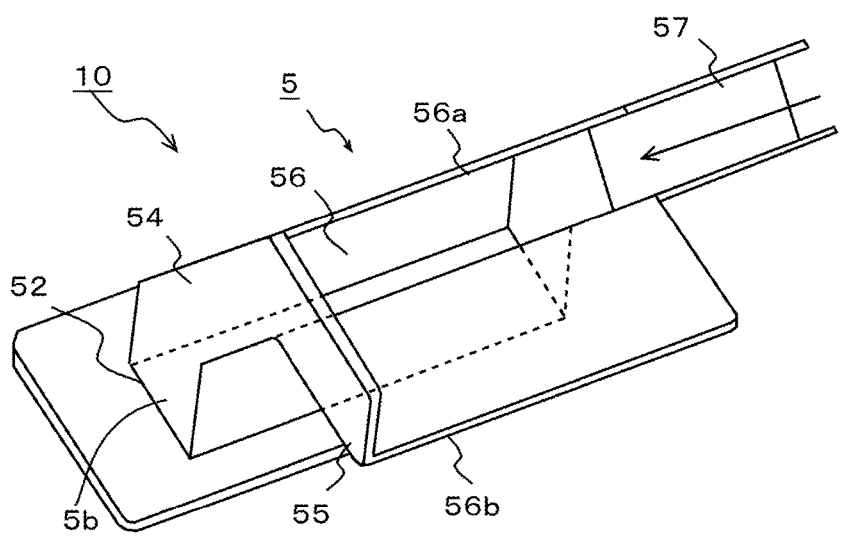
[FIG. 4C]
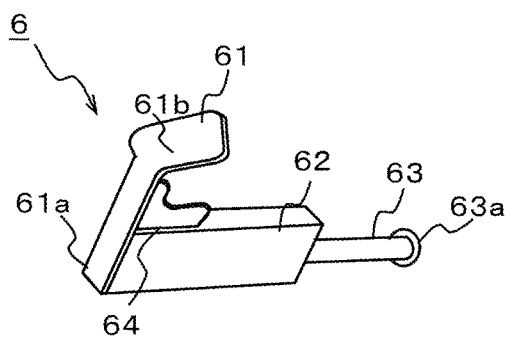

[FIG. 5A]
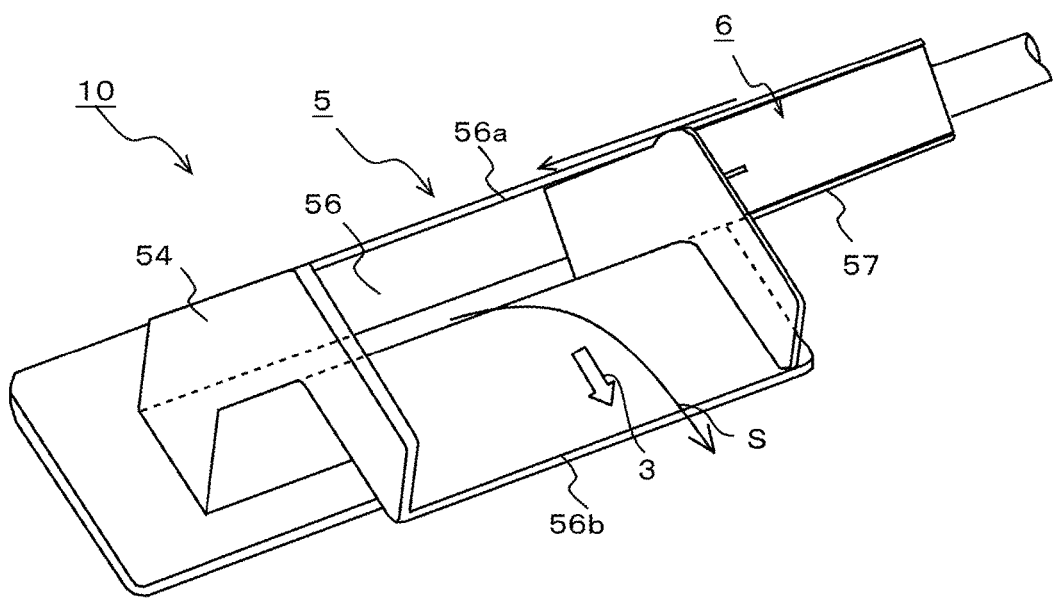
[FIG. 5B]
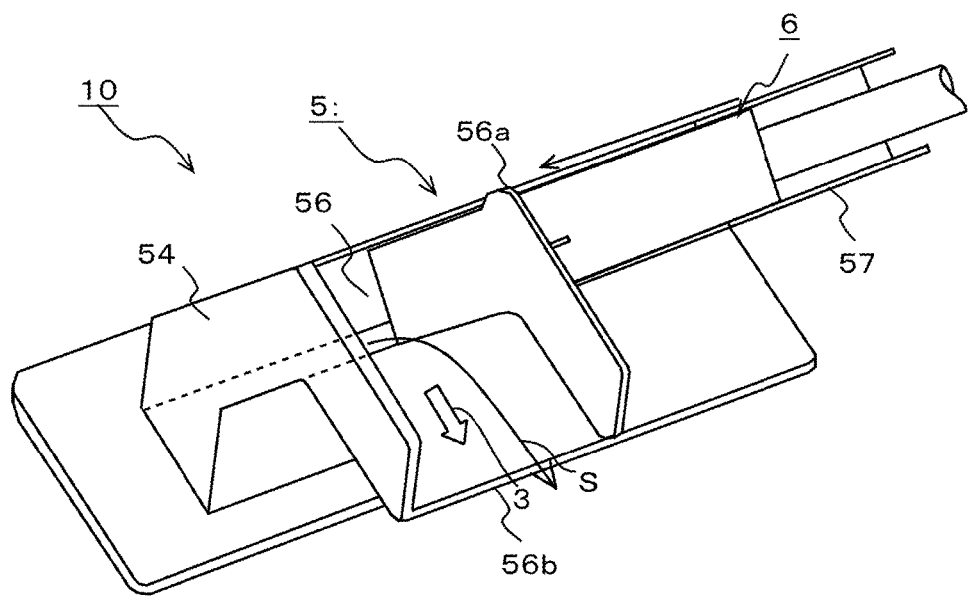

[FIG. 6]
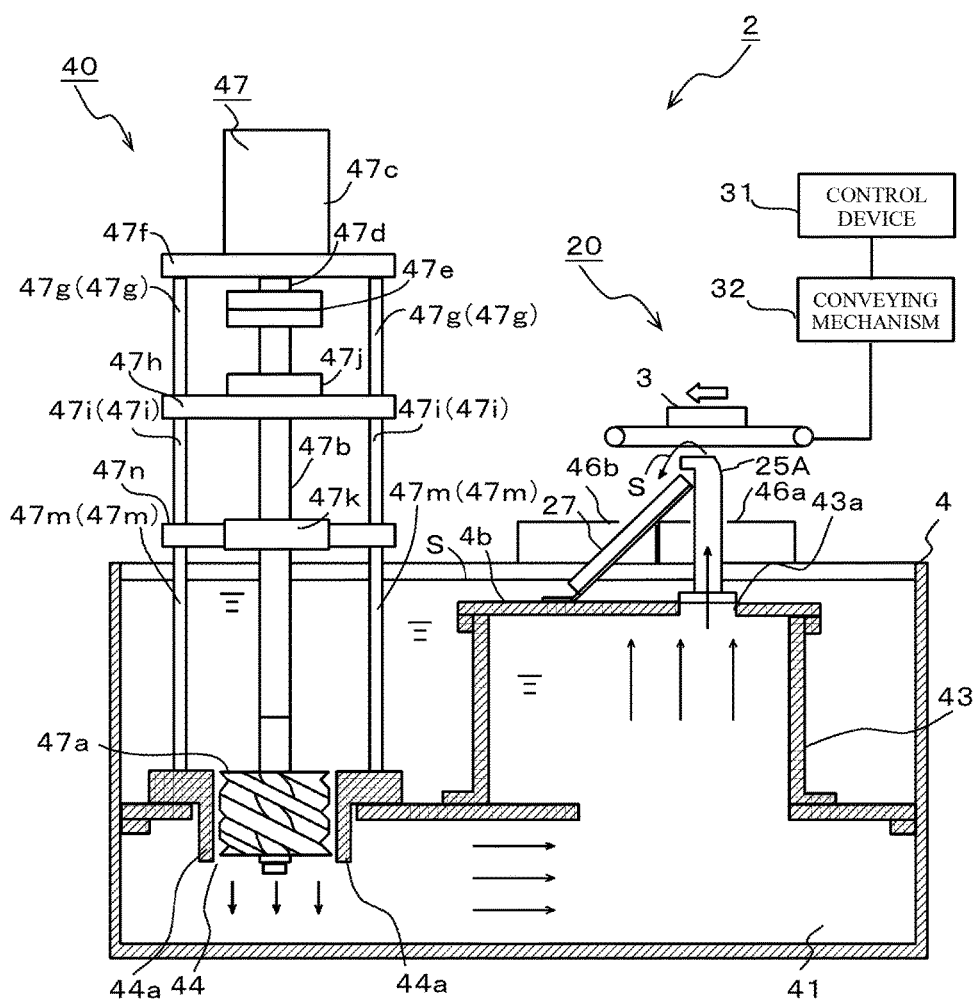

[FIG. 7]
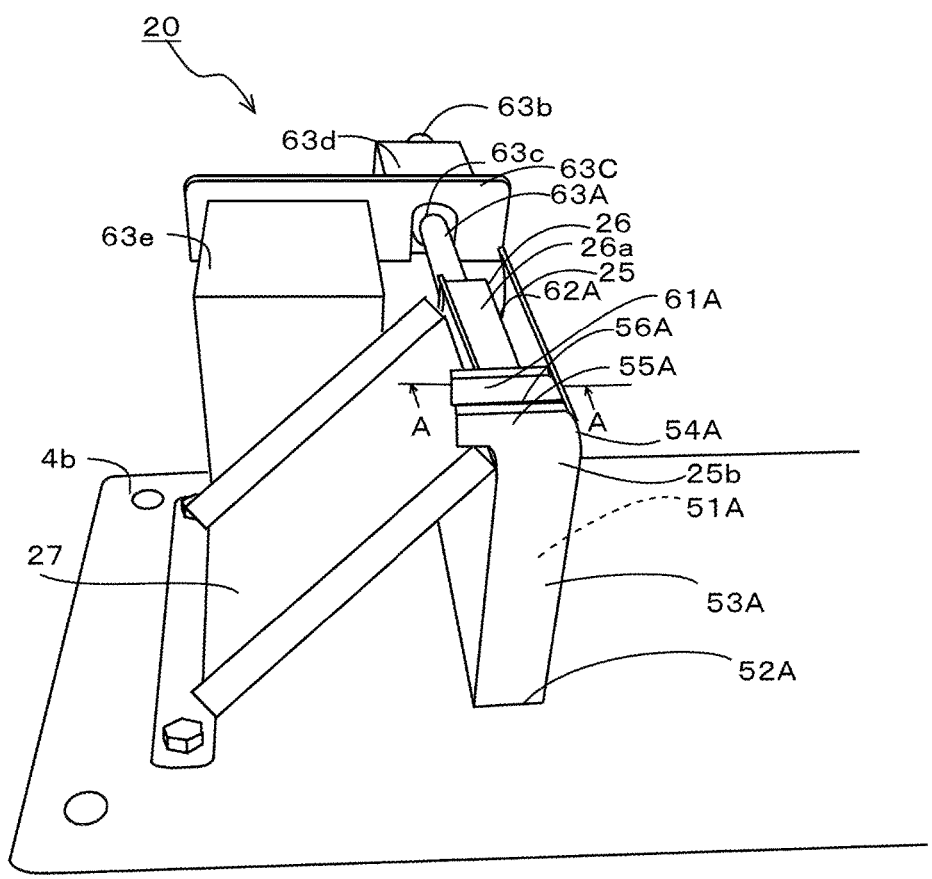

[FIG. 8A]
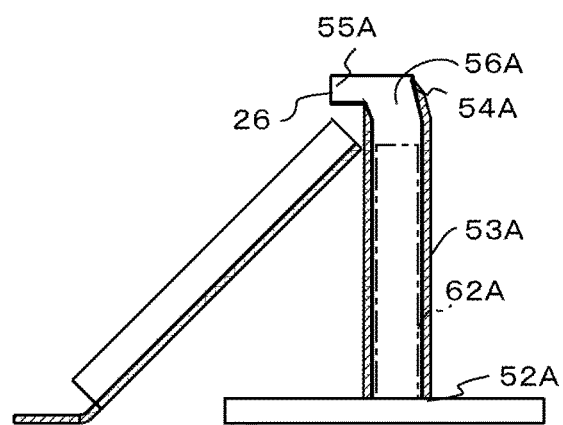
[FIG. 8B]
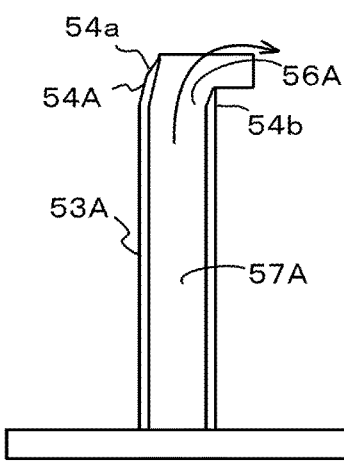
[FIG. 8C]
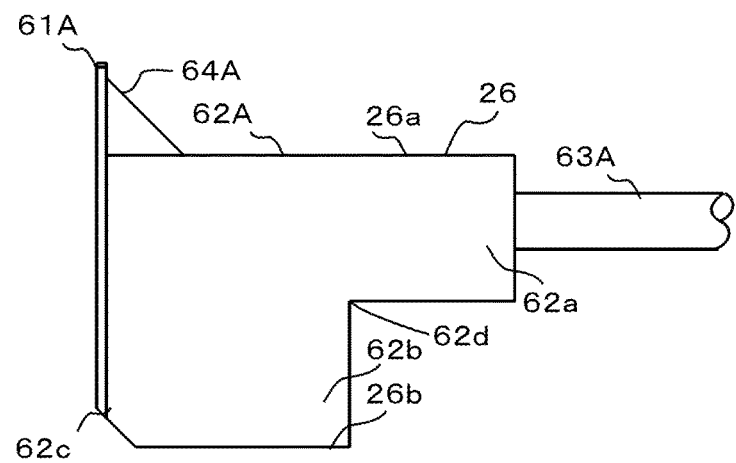

[FIG. 9A]
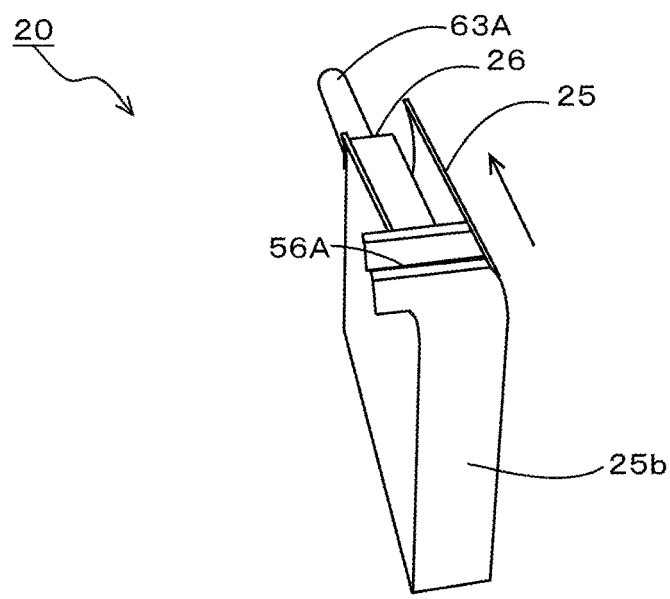
[FIG. 9B]
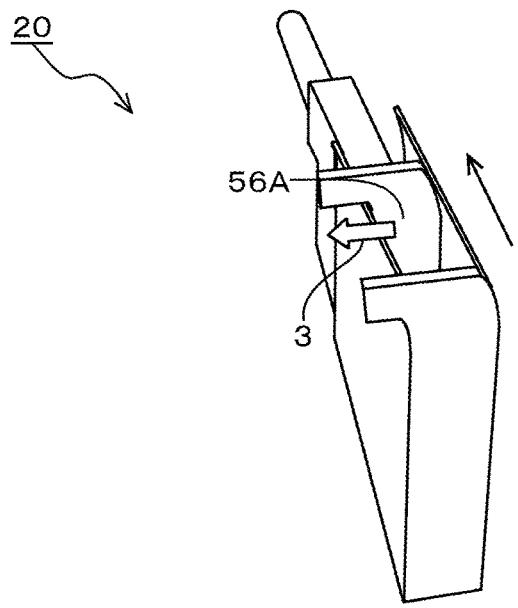

[FIG. 10A] Related Art 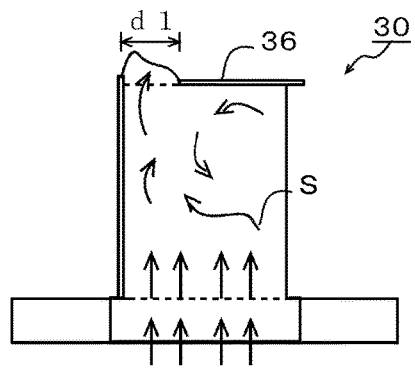
[FIG. 10B] Related Art 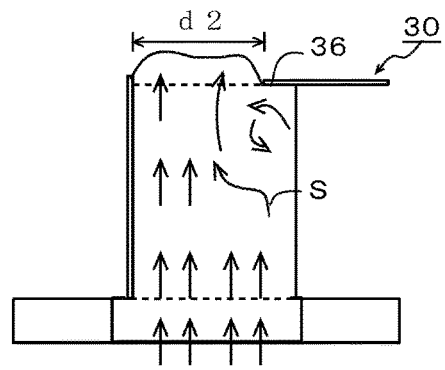
[FIG. 11A] 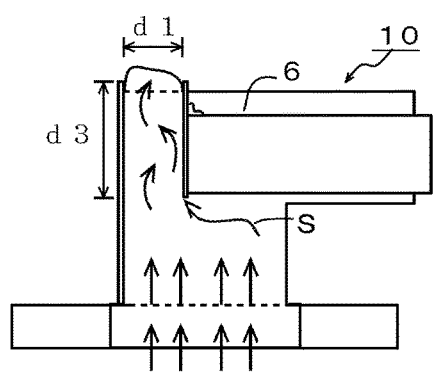
[FIG. 11B] 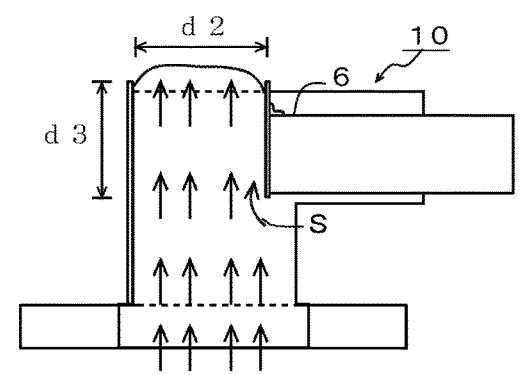
[FIG. 12A] 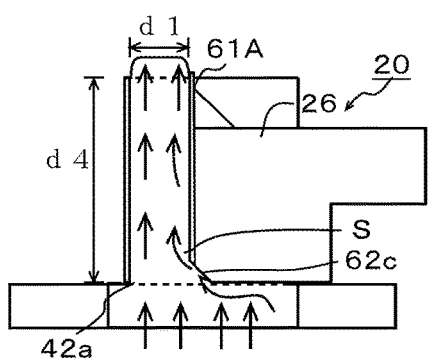
[FIG. 12B] 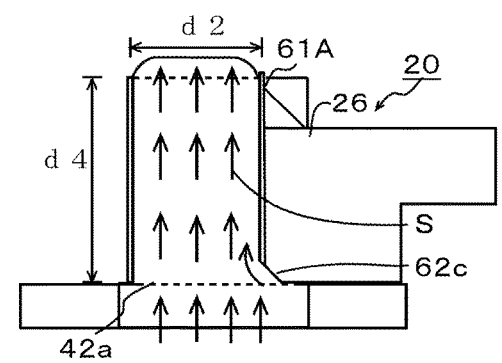

JET NOZZLE AND JET SOLDERING APPARATUS

CROSS REFERENCE TO RELATED APPLICATION

The present invention contains subject matter related to Japanese Patent Application JP 2015-179350 filed in the Japanese Patent Office on Sep. 11, 2015, the entire contents of which being incorporated herein by reference.

BACKGROUND OF THE INVENTION

Field of the Invention

The present invention relates to a jet nozzle that jets out molten solder to a portion to be soldered of a print circuit board and a jet soldering apparatus using the same.

Description of Related Art

In the past, the jet soldering apparatus has been often used in a case where soldering an electronic component on a printed circuit board. In the jet soldering apparatus, a fluxer, a preheater, a jet solder bath, a cooler and the like are installed at their suitable positions. When the jet soldering apparatus solders the electronic component on the printed circuit board, a soldering process is completed such that the fluxer applies flux onto the portion to be soldered of a print circuit board, then the preheater previously heats the printed circuit board, the jet soldering apparatus solders the electronic component on the printed circuit board, and the cooler cools the printed circuit board.

For example, the jet soldering apparatus by which a width of a nozzle for jetting the molten solder can be changed so as to meet a width of a region to be partially soldered of the printed circuit board has been known as the soldering apparatus that solders the region to be soldered. The following will describe a method of soldering the printed circuit board 3 by using this jet soldering apparatus with reference to FIG. 1.

When soldering a relatively narrow region 3A to be partially soldered of the printed circuit board 3, the jet soldering apparatus first meets a width of its nozzle to a width A1 of the region 3A to be soldered of the printed circuit board 3 and then, jets the molten solder. The jet soldering apparatus conveys the printed circuit board 3 on a direction along a black arrow B1 shown in FIG. 1 with jetting the molten solder to allow the region 3A to contact the jetted molten solder. This applies to a case where terminal pins and the like aligned like one row on the printed circuit board are soldered.

When soldering a region 3B to be partially soldered of the printed circuit board 3, a width of which is similar to the maximum width A2 of the nozzle, the jet soldering apparatus widens a width of its nozzle to the maximum width A2 and then, the jet soldering apparatus solders the printed circuit board with conveying the printed circuit board 3 on a direction along a black arrow B2 shown in FIG. 1. This applies to a case where rectangular electronic components and the like aligned like one or more rows on the printed circuit board are soldered.

When soldering a region 3C to be partially soldered of the printed circuit board 3, a width A3 of which is wider than the maximum width A2 of the nozzle, the jet soldering apparatus solders the region 3C to be partially soldered of the printed circuit board 3 by soldering it separately, for example, two times. The jet soldering apparatus first conveys the printed circuit board 3 on a direction along an upper black arrow B31 shown in FIG. 1 while the width of the nozzle is kept to be maximum width A2. This allows an upper portion of the region C3 shown in FIG. 1 to be soldered. Then, the jet soldering apparatus reduces a width of its nozzle and solders a lower portion of the region C3 shown in FIG. 1 to be soldered with conveying the printed circuit board 3 on a direction along a lower black arrow B32 shown in FIG. 1. This applies to a case where rectangular electronic components and the like aligned like plural rows on the printed circuit board are soldered.

The direction along which the soldering is performed is not limited to one direction described above: When soldering a region 3D to be partially soldered of the printed circuit board 3, the jet soldering apparatus sets the width of the nozzle to be a width A4 after a direction of the printed circuit board 3 has turned around 90 degrees and solders the region 3D with conveying the printed circuit board 3 on a direction along a black arrow B4 shown in FIG. 1.

Regarding such a jet soldering apparatus, Japanese Patent No. 3910797 discloses a soldering system in which a mechanism for varying a molten solder blow-off port by opening or closing a shatter is provided and a work to be soldered is conveyed along its plate surface direction with an elevation angle. Japanese Patent Publication No. H07-41411 discloses a soldering apparatus providing with a shatter mechanism, an opening area of which can vary based on an area for supplying solder to a printed circuit board.

SUMMARY OF INVENTION

Although by the above-mentioned Japanese patent documents, it is possible to change the opening area using the shatter in order to adjust an area to be soldered matching with a shape of the region to be soldered of the printed circuit board, the molten solder becomes turbulent flow (swirling current) while it rises within a nozzle, so that it may be difficult to maintain a height of the molten solder jetted from a tip of the nozzle constant.

The present invention addresses the above-described issue. The present invention has an object to provide a jet nozzle and a jet soldering apparatus using the same in which the molten solder flow jetted from the tip of the nozzle can be maintained constant according to a width and/or position of the region to be soldered of the printed circuit board and the molten solder flow can have a constant height of the molten solder jetted from the tip of the nozzle, thereby allowing a constant soldering to be performed on a desired position.

In order to achieve the object, a jet nozzle reflecting one aspect of the present invention is configured to vary a width of a flow of jetted molten solder. The jet nozzle contains a nozzle main body having a frame shape with upper and lower opening ends, the lower opening end being opposed to a soldering bath and the upper opening end jetting the molten solder flow, a part of the nozzle main body having a channel section, and a molten solder flow width varying member that varies a width of the upper opening end of the nozzle main body by a slide of the molten solder flow width varying member within the channel section of the nozzle main body to vary a width of the flow of the molten solder jetted from the upper opening end of the nozzle main body. The molten solder flow width varying member includes a molten solder flow width varying plate that varies the width of the flow of the molten solder, a rectangular rectifying piece that is attached to the molten solder flow width varying plate at an opposite side of the upper opening end of the nozzle main body and extends along a slide direction of the molten solder flow width varying member, and a sliding shaft that slides the rectifying piece.

According to embodiments of the present invention, it is desired to provide a jet nozzle wherein the nozzle main body contains a bending portion that bends along a jetting direction of the molten solder jetted from the nozzle main body.

It is further desired to provide a jet nozzle wherein the molten solder flow width varying member further includes a reinforcing member that is attached to an angle formed by the molten solder flow width varying plate and the rectifying piece to reinforce the molten solder flow width varying plate.

It is additionally desired to provide a jet nozzle further containing a plunger that plunges the sliding shaft.

It is still further desired to provide a jet nozzle wherein the rectifying piece contains a cut-away portion that is obliquely cut away from a side surface of the rectifying piece to a bottom thereof, the cut-away portion being configured to guide the flow of the molten solder.

It is still additionally desired to provide a jet nozzle further containing an inclined plate that has an inclination along a flowing direction of the molten solder jetted from the upper opening end of the nozzle main body.

Further, in order to achieve the object, a jet soldering apparatus reflecting another aspect of the present invention contains any one of the above-mentioned jet nozzle, a supplying device that supplies molten solder to the jet nozzle, a conveying mechanism that conveys a printed circuit board horizontally along the upper opening end of the nozzle main body, and a control device that is configured to vary a width of the upper opening end of the nozzle main body so as to meet a width of the region to be partially soldered of the printed circuit board, adjust an amount of the supplied molten solder so as to meet the varied width of the upper opening end of the nozzle main body, contact one end of the region to be partially soldered of the printed circuit board with the jetted molten solder, and convey the printed circuit board by sequentially moving the contact thereof toward the other end of the region to be partially soldered of the printed circuit board.

It is desired to provide a jet soldering apparatus wherein the control device is configured to control the conveying mechanism to convey the printed circuit board toward the same direction as the jetting direction of the molten solder jetted from the upper opening end of the nozzle main body.

Other objects and attainments of the present invention will be become apparent to those skilled in the art upon a reading of the following detailed description when taken in conjunction with the drawing.

BRIEF DESCRIPTION OF DRAWINGS

FIG. 1 is a plan view of a printed circuit board for illustrating regions to be partially soldered according to a related art.

FIG. 2 is a sectional view of a jet soldering apparatus for illustrating a configuration example thereof according to a first embodiment of this invention.

FIG. 3 is a perspective view of a jet nozzle for illustrating a configuration example thereof according to a first embodiment of this invention.

FIG. 4A is a side view of the jet nozzle for illustrating a configuration example thereof.

FIG. 4B is a perspective view of a nozzle main body for illustrating a configuration example thereof.

FIG. 4C is a perspective view of a molten solder flow width varying member for illustrating a configuration example thereof.

FIG. 5A is a diagram for illustrating an operation example of the jet nozzle.

FIG. 5B is a diagram for illustrating an operation example of the jet nozzle.

FIG. 6 is a sectional view of a jet soldering apparatus for illustrating a configuration example thereof according to a second embodiment of this invention.

FIG. 7 is a perspective view of a jet nozzle for illustrating a configuration example thereof according to the second embodiment of this invention.

FIG. 8A is a sectional view of the jet nozzle, taking along the lines A-A shown in FIG. 7 according to the second embodiment of this invention for illustrating a configuration example thereof.

FIG. 8B is a plan view of a nozzle main body according to the second embodiment of this invention for illustrating a configuration example thereof.

FIG. 8C is a plan view of a molten solder flow width varying member according to the second embodiment of this invention for illustrating a configuration example thereof.

FIG. 9A is a diagram for illustrating an operation example of the jet nozzle according to the second embodiment of this invention.

FIG. 9B is a diagram for illustrating an operation example of the jet nozzle according to the second embodiment of this invention.

FIG. 10A is a sectional view of a nozzle according to a related art for illustrating an operation example thereof.

FIG. 10B is a sectional view of the nozzle according to the related art for illustrating an operation example thereof.

FIG. 11A is a sectional view of the jet nozzle according to the first embodiment of the invention for illustrating an operation example thereof.

FIG. 11B is a sectional view of the jet nozzle according to the first embodiment of the invention for illustrating an operation example thereof.

FIG. 12A is a sectional view of the jet nozzle according to the second embodiment of the invention for illustrating an operation example thereof.

FIG. 12B is a sectional view of the jet nozzle according to the second embodiment of the invention for illustrating an operation example thereof.

DESCRIPTION OF PREFERRED EMBODIMENTS

The following will describe preferred embodiments of an image-forming apparatus according to the present invention with reference to the attached drawings. Such description does not limit the technical scope, meaning of terms and the like in Claims. Size and/or ratio in the drawings are exaggerated for convenience of explanation and they may be different from real ones.

The following will describe preferred embodiments of the jet nozzle according to this invention and the jet soldering apparatus using the jet nozzle with reference to the drawings.

First Embodiment

The following will describe a configuration example of a first embodiment of a jet soldering apparatus 1 and a jet nozzle 10 with reference to FIGS. 2 through 4C.

As shown in FIG. 2, the jet soldering apparatus 1 solders a printed circuit board 3 as shown in FIG. 1 by contacting its region to be partially soldered with the jetted (spouted) molten solder S while conveying the printed circuit board 3 along a direction of an arrow defined by outline as shown in FIG. 2. The jet soldering apparatus 1 contains a solder bath 4 accommodating the molten solder S and the jet nozzle 10 which is mounted on the solder bath 4 and jets the molten solder S onto a surface to be soldered of the printed circuit board 3. The jet soldering apparatus 1 also contains a supplying device 40 which supplies the molten solder S to the jet nozzle 10, a control device 31 that is configured to vary a width of the jet nozzle 10 to meet a width of the region to be partially soldered of the printed circuit board 3, and a conveying mechanism 32 that conveys the printed circuit board 3.

The solder bath 4 accommodates the molten solder S with a predetermined depth. The solder bath 4 is divided into two parts vertically by a metal plate and the like. At its lower part, a refloating room 41 is set so as to refloat the molten solder S toward the jet nozzle 10. This refloating room 41 includes a duct 43 provided with an opening portion 43a at its upper surface 4b and joined together with the jet nozzle 10 below it and a housing 44a having a cylindrical opening portion 44 below the opening portion 43a. The opening portions 43a and 44 are arranged at different positions horizontally. At an upper part of the solder bath 4, lids 46a, 46b each having an opening at their upper portions are respectively installed, and the jet nozzle 10 is mounted so as to be protruded from the openings.

A screw pump 47 as an example of the supply device 40 of the molten solder S includes a screw 47a which stays within the opening portion 44 of the housing 44a, a driving shaft 47b extending from the screw 47a, a motor 47c, a motor rotating shaft 47d and a coupling 47e that couples this motor rotating shaft 47d with the driving shaft 47b mutually. Such a configuration enables rotation of the motor 47c to be transferred to the driving shat 47b through the motor rotating shaft 47d and the coupling 47e to rotate the screw 47a. Further, the motor 47c is mounted and supported on a mounting plate 47f. A mounting plate 47h supports an existing bearing 47j for the driving shaft 47b. A mounting plate 47n supports an existing bearing 47k for the driving shaft 47b. The bearings 47j, 47k bear the driving shaft 47b so as to be able to rotate. The housing 44a supports the mounting plate 47n by four support columns 47m. The mounting plate 47n supports the mounting plate 47h by four support columns 47i. The mounting plate 47h supports the mounting plate 47f by four support columns 47g. The screw 47a has plural blades.

As shown in FIG. 3, the jet nozzle 10 can vary a width of the jetted molten solder S (by varying a width of the upper opening end of the nozzle main body). The jet nozzle 10 contains a nozzle main body 5 having an upper opening end 56 through which the molten solder is jetted and a molten solder flow width varying member 6 that varies a width of the upper opening end 56 of the nozzle main body 5 by a slide of the molten solder flow width varying member 6 within the nozzle main body 5. The nozzle main body 5 is attached onto the duct 43 by screws, not shown, or the like over the opening portion 43a of the upper surface 4b thereof. The jet nozzle 10 may include an inclined plate 7 that returns the jetted molten solder S to the solder bath 4, a heater 8 that heats space within the lid 46a, and a plunger 9 that slides the molten solder flow width varying member 6.

The nozzle main body 5 has a rectangular hollow 51 at a bottom and a channel section at upper portion. The nozzle main body 5 has a base portion 52 assembled to be opposed to the soldering bath 4. The nozzle main body 5 jets the molten solder S from the upper opening end 56.

In this embodiment, a shape of the nozzle main body 5 is configured to be able to flow the molten solder S along a jetting direction of the molten solder S vertically jetted. As shown in FIG. 4A, the nozzle main body 5 contains a lower portion 53 that has a rectangular section and vertically extends from a base portion 52, a bending portion 54 that extends from the lower portion 53 to bend at a predetermined height with an obtuse angle, a horizontal portion 55 that extends from the bending portion 54 to bend with an obtuse angle so that the horizontal portion 55 becomes almost horizontal with the base portion 52. The nozzle main body 5 contains a side wall 5b at a side which is opposite side of the plunger 9 (see FIG. 3). The side wall 5b is configured to be side walls of the lower portion 53, the bending portion 54, and the horizontal portion 55.

As shown in FIG. 4B, the bending portion 54 is opened at its upper end to be the upper opening end 56 of the nozzle main body 5. As shown in FIG. 3, the nozzle main body 5 contains an attaching portion 57 that attaches the molten solder flow width varying member 6 at a side of the bending portion 54 which is an opposite side of the side wall 5b. The attaching portion 57 projects from the side of the bending portion 54 and has a channel section to open at a horizontal surface thereof that is horizontal to the upper opening end 56 of the nozzle main body 5 and at a side surface thereof that is adjacent to the upper opening end 56 of the nozzle main body 5.

The bending portion 54 has at an upper end a folded portion 56a that guides a jetting direction of the molten solder S over the upper opening end 56 of the nozzle main body 5. The horizontal portion 55 includes a solder-turning portion 56b that extends horizontally relative to the base portion 52 and as a part of the side wall 5b. The solder-turning portion 56b guides the flow of the molten solder S jetted from the upper opening end 56 of the nozzle main body 5 to the inclined plate 7, as shown in FIG. 3, in order to prevent the molten solder S from scattering to another member. The bending portion 54, the folded portion 56a and the solder-turning portion 56b allow the flow of the molten solder S to be directed toward one direction and from a side of the folded portion 56a to a side of the solder-turning portion 56b without leaking any molten solder S, thereby enabling jetting the molten solder S.

As shown in FIG. 4C, the molten solder flow width varying member 6 includes a molten solder flow width varying plate 61 that varies the width of the molten solder flow, a rectangular cubic rectifying piece 62 that is attached to the molten solder flow width varying plate 61 at an opposite side of the upper opening end 56 of the nozzle main body 5 and extends along a slide direction of the molten solder flow width varying member 6, and a sliding shaft 63 that slides the rectifying piece 62.

The molten solder flow width varying plate 61 extends along the jetting direction of the molten solder S. The molten solder flow width varying plate 61 has a rectangular base portion 61a with a shape which is almost similar to a shape of a part of the side wall 5b of the nozzle main body 5 corresponding to the bending portion 54. The molten solder flow width varying plate 61 also has a flow width varying surface portion 61b that varies a width of the flow of the molten solder S and extends from short sides of the base portion 61a to be inclined. A bended angle formed between the base portion 61a and the flow width varying surface portion 61b is the same as the bended angle formed between the bending portion 54 and the horizontal portion 55. The base portion 61a is configured to be a plate having a slightly smaller size than that of a part of the side wall of the nozzle main body 5 corresponding to the bending portion 54 because the base portion 61a is enclosed within the nozzle main body 5. The flow width varying surface portion 61b is configured to be roundly rectangular and has a shape that is almost similar to that of a part of the side wall 5b of the nozzle main body 5 corresponding to the horizontal portion 55, as shown in FIG. 4A.

The rectifying piece 62 has a square prism shape that has a first side, a length of which is the same length as that of the upper opening end 56 of the nozzle main body 5; a second side, a length of which is the same length as that of the short side of the base portion 61a, and a third side, a length of which is be shorter than the longer side of the base portion 61a. The molten solder flow width varying member 6 may include a reinforcing member 64 that is attached to an angle formed by the molten solder flow width varying plate 61 and the rectifying piece 62. The reinforcing member 64 acts to reinforce the molten solder flow width varying plate 61 so that the molten solder flow width varying plate 61 cannot be deformed by pushing of the molten solder S. The reinforcing member 64 of this embodiment is configured to be a roundly thin plate having an almost L-shaped and to be connected to a base surface of the base portion 61a and a side surface of the rectifying piece 62.

The sliding shaft 63 extends from the rectifying piece 62 along a sliding direction of the molten solder flow width varying member 6 on an opposite side of the molten solder flow width varying plate 61. The sliding shaft 63 of this embodiment passes through a shaft-supporting member 63B, as shown in FIG. 3, and has a flange part 63a at a forward end of the sliding shaft 63. The shaft-supporting member 63B is fixed to the upper surface 4b of the duct 43 of the solder bath 4 shown in FIG. 2 by screws, not shown, or the like.

As shown in FIGS. 4B and 4C, the molten solder flow width varying member 6 is assembled into the attaching portion 57 from a side of the attaching portion 57 along a direction indicated by an arrow shown in FIG. 4B by horizontally positioning the molten solder flow width varying plate 61, the rectifying piece 62 and the sliding shaft 63 and facing a forward end of the flow width varying surface portion 61b to a side of the upper opening end 56 of the nozzle main body 5.

As shown in FIG. 2, the inclined plate 7 may be mounted on the upper surface 4b of the duct 43 of the solder bath 4 by screws, not shown, or the like. As shown in FIG. 3, the inclined plate 7 has an inclination along a flowing direction of the molten solder S jetted from the upper opening end 56 of the nozzle main body 5. The inclined plate 7 includes a horizontal part at its upper end, and an inclined part which connects the horizontal part and is inclined downward. Two side walls vertically stand upward. The inclined plate 7 is installed so that the upper end of the inclined plate 7 is positioned below the horizontal portion 55 of the nozzle main body 5. The inclined plate 7 is provided for wakening force of the molten solder S jetted from the upper opening end 56 of the nozzle main body 5 by its inclined surface and preventing oxide from occurring at a convergent position between the molten solder S jetted from the upper opening end 56 of the nozzle main body 5 and the molten solder S within the solder bath 4.

In this embodiment, a heater 8 that heats space in the lid 46a is provided. In order to heat the molten solder S in the nozzle body 5 within the lid 46a, the heater 8 has a configuration such that a duct communicated to inside and outside of the lid 46a is connected to a heating device, not shown. The heater 8 heats the molten solder S up to a predetermined temperature. Further, when it is possible to heat the molten solder s at the predetermined temperature, the heater is not limited to such a configuration: A configuration to directly heat the nozzle main body 5 may be used.

The plunger 9 of this embodiment connects a control device 31. The control device 31 controls the plunger 9 to slide the molten solder flow width varying member 6 forward or backward. The plunger 9 includes a sliding shaft portion 91 that is configured to be a sliding shaft, a supporting plate 92 that is attached to a forward end of the sliding shaft portion 91, and a shaft-supporting portion 93 that connects the supporting plate 92 and supports the flange portion 63a of the sliding shaft 63.

The sliding shaft portion 91 projects from a side surface of the plunger 9 and is attached to the plunger 9 so as to be slidable. The supporting plate 92 is a rectangular plate. The forward end of the sliding shaft portion 91 is connected to a center of the supporting plate 92. The shaft-supporting portion 93 has a concave surface at a side surface. The shaft-supporting portion 93 also has an arc-shaped recess 93a with an open top for receiving the flange 63a at a center of the concave surface and an upper side edge of the side surface of the shaft-supporting portion 93. The shaft-supporting portion 93 further has an arc-shaped recess 93b, which has a smaller radius than that of the recess 93a, with an open top for receiving the sliding shaft 63 at a center of the concave surface and the other upper edge of the side surface of the shaft-supporting portion 93.

The shaft-supporting portion 93 is fixed to the supporting plate 92 by screws, not shown, or the like while the plunger faces the side surface thereof having the concave surface. The supporting plate 92 and the shaft-supporting portion 93 are fixed to each other by screws, not shown, or the like so that supporting plate 92 maintains the concave surface of the side surface of the shaft-supporting portion 93. The flange portion 63a enters into a portion between the supporting plate 92 and the shaft-supporting portion 93, so that the sliding shaft 63 is supported by the recess 93b from below and the flange 63a is supported by the recess 93a from below. This enables the plunger 9 and the molten solder flow width varying member 6 to be connected to each other.

<Operation Examples of Jet Soldering Apparatus 1 and Jet Nozzle 10>

FIG. 5A shows a case where the molten solder flow width varying member 6 is assembled to the nozzle main body 5 and the molten solder flow with a maximum width is jetted. This applies to a case where the soldering is performed on the region 3B or the like to be partially soldered of the printed circuit board 3 shown in FIG. 1 and corresponds to a state of the jet nozzle 10 shown in FIG. 11B. In this moment, the sliding shaft portion 91 of the plunger 9 shown in FIG. 3 is retracted within the plunger 9 at the maximum. FIG. 5B shows a case where the plunger 9 plunges the sliding shaft portion 91 to slide the molten solder flow width varying member 6 so that the molten solder flow with a narrower width is jetted. This applies to a case where the soldering is performed on the region 3A or the like to be partially soldered of the printed circuit board 3 shown in FIG. 1 and corresponds to a state of the jet nozzle 10 shown in FIG. 11A.

The following will describe operation examples of the jet soldering apparatus 1 and the jet nozzle 10 when the width of the molten solder flow jetted from the jet nozzle 10 as shown in FIG. 5A is reduced to the width of the molten solder flow jetted from the jet nozzle 10 as shown in FIG. 5B and the soldering is performed on the region 3A to be partially soldered of the printed circuit board 3 shown in FIG. 1, with reference to FIGS. 1, 2, 3, 5A and 5B.

A user inputs a width and a position of the region 3A to be partially soldered of the printed circuit board 3 which a conveying mechanism 32 conveys using an input portion, not shown. In this moment, any conditions such as a width of the printed circuit board 3 and heating temperature of the molten solder S may be input. The control device 31 controls the plunger 9 shown in FIG. 3 to plunge the sliding shaft portion 91, corresponding to the input region 3A to be partially soldered of the printed circuit board 3. When plunging the flange portion 63a of the sliding shaft 63, the molten solder flow width varying member 6 slides along an arrow shown in FIG. 5A, so that the upper opening end 56 of the nozzle main body 5 becomes narrower. This enables the width of the upper opening end 56 of the nozzle main body 5 to correspond to the width of the input region 3A to be partially soldered of the printed circuit board 3. The control device 31 controls the screw pump 47 shown in FIG. 2 to reduce revolution number of the screw 47a thereof according to the reduced width of the molten solder flow, so that the control device 31 is configured to adjust an amount of the jetted molten solder S to be reduced and make a height of the jetted molten solder S unchanged as compared with that before the width variation. This allows the height of the molten solder flow jetted from the upper opening end 56 of the nozzle main body 5 to be made even and constant so that it is possible to perform the even and constant soldering on the printed circuit board 3 regardless of the width of the upper opening end 56.

The control device 31 control the motor 47c to drive, the revolution force of the motor 47c is transferred to the motor rotating shaft 47d and the coupling 47e in order so that the driving shaft 47b rotates. When rotating the driving shaft 47b, the screw 47a of the lower portion of the driving shaft 47b also rotates. When the screw 47a rotates, the screw 47a forcefully feeds the molten solder S toward a direction indicated by arrows shown in FIG. 2, passing through between the blades of the screw 47a, so that the molten solder S enters into the refloating room 41, which is positioned at a lower position, from the opening portion 44, which is positioned at an upper position. The molten solder S entered into the refloating room 41 changes its flowing direction to the horizontal direction and is forcefully fed upward. The molten solder S is then forcefully fed within the jet nozzle 10 from the opening portion 43a of the duct 43 and is jetted from the jet nozzle 10.

The molten solder S is then forcefully fed upward along the bending portion 54 of the nozzle main body 5 as indicated by an arrow S shown in FIG. 5A and is guided from the side of the folded portion 56a to the side of the solder-turning portion 56b to be jetted from the upper opening end 56 of the nozzle main body 5.

The control device 31 controls the conveying mechanism 32 to convey the printed circuit board 3 horizontally along the upper opening end 56 of the nozzle main body 5 and the same direction as the jetting direction of the molten solder S at the upper opening end 56, as indicated an arrow defined by outlines in FIG. 5A. Namely, the conveying mechanism 32 conveys the printed circuit board 3 horizontally from the side of the folded portion 56a of the nozzle main body 5 to the side of the solder-turning portion 56b through a position over the upper opening end 56 of the nozzle main body 5.

By contacting the molten solder S with the region 3A to be partially soldered of the printed circuit board 3 shown in FIG. 1 when the printed circuit board 3 passes through the position over the upper opening end 56 of the nozzle main body 5, the printed circuit board 3 is soldered. More in detail, the control device 31 controls the conveying mechanism 32 to convey the printed circuit board 3 so that an end 3a of the region 3A to be partially soldered of the printed circuit board 3 is positioned at the position over the upper opening end 56 of the jet nozzle 10. By contacting the end 3a with the molten solder flow, the end 3a is soldered. When the control device 31 controls the conveying mechanism 32 to convey the printed circuit board 3 along the direction indicated by the arrow B1 shown in FIG. 1 and horizontally over the upper opening end 56, a region to be soldered with the molten solder flow in the printed circuit board 3 is transferred sequentially to an opposite direction of the direction indicated by the arrow B1. When the other end 3b of the region 3A to be partially soldered of the printed circuit board 3 is positioned at the position over the upper opening end 56 and the end 3b is soldered, the soldering is completed.

The inclined plate 7 shown in FIG. 2 receives excess molten solder S which is jetted from the upper opening end 56 but is not adhered to the printed circuit board 3. The excess molten solder S is returned from the inclined plate 7 to the solder bath 4. The molten solder S thus returned to the solder bath 4 is sent to the opening portion 44 of the housing 44a and circulated.

When it is insufficient to solder the region to be partially soldered of the printed circuit board 3 by passing through the printed circuit board 3 over the jet nozzle 10 only once because the region to be partially soldered of the printed circuit board 3 is too wide, the printed circuit board 3 is repeatedly conveyed over the jet nozzle 10 until the soldering is completed and is completely soldered.

The control device 31 controls the screw 47a to adjust the revolution number thereof, so that it is possible to vary height of the jetted molten solder S. The control device 31 controls the screw 47a to keep the revolution number thereof, so that it is possible to keep height of the jetted molten solder S constant. Since the molten solder S is sent efficiently and evenly, the molten solder S is jetted from the opening portion 43a to the jet nozzle 10 without forming any wave or eddy current.

Regarding solder bath, it is not limited to the solder bath 4 in this invention: any other solder bath having a configuration such that the molten solder S can be sent to the jet nozzle 10 may be applied.

According to the jet nozzle 10 of this embodiment, when varying the width of the jetted molten solder flow by sliding the molten solder flow width varying member 6 forward or backward based on the width and/or position of the region to be partially soldered of the printed circuit board 3, the molten solder S jetted from the upper opening end 56 of the jet nozzle 10 has the even and constant height (which is a jetted flow that is near a laminar flow). Accordingly, it is possible to perform the even and constant soldering regardless of the width of the upper opening end 56 of the jet nozzle 10.

According to the embodiment, it is configured for the conveying mechanism 32 to convey the printed circuit board 3 horizontally along the same direction as the jetting direction of the molten solder S in the opening portion 56. The conveying direction of the printed circuit board 3 may be an opposite direction of the jetting direction of the molten solder S or a direction not extending along the jetting direction of the molten solder S. By, however, conveying the printed circuit board 3 to the above-mentioned direction in this embodiment, it is possible to solder the printed circuit board 3 evenly without generating any solder bridge. Although an angle of conveyance of the printed circuit board 3 may vary without conveying the printed circuit board 3 horizontally over the opening portion 56, a configuration is adapted in this embodiment such that the printed circuit board 3 is horizontally conveyed, so that a complexed position coordinate calculation system for controlling the conveying direction of the printed circuit board 3 is unnecessary, thereby enabling manufacturing costs of the apparatus to be reduced.

Second Embodiment

The following will describe a configuration example of a second embodiment of a jet nozzle 20 and a jet soldering apparatus 2 including the jet nozzle 20 and with reference to FIGS. 6 through 8C. The jet soldering apparatus 2 uses the jet nozzle 20 for the jet nozzle 10 of the jet soldering apparatus 1 according to the first embodiment as shown in FIG. 2. Accordingly, the similar codes will be applied to the members similar to the members of the first embodiment, thereby omitting their detailed explanation.

As shown in FIG. 6, the jet soldering apparatus 2 solders a printed circuit board 3 by contacting its region to be partially soldered with the jetted (spouted) molten solder S while conveying the printed circuit board 3 along a direction of an arrow defined by outline as shown in FIG. 6. The jet soldering apparatus 2 contains a solder bath 4 accommodating the molten solder S and the jet nozzle 20 which is mounted on the solder bath 4 and jets the molten solder S onto a surface to be soldered of the printed circuit board 3. The jet soldering apparatus 2 also contains a supplying device 40 which supplies the molten solder S to the jet nozzle 20, a control device 31 that is configured to vary a width of the jet nozzle 20 to meet a width of the region to be partially soldered of the printed circuit board 3, and a conveying mechanism 32 that conveys the printed circuit board 3.

In this embodiment, as shown in FIG. 6, the jet nozzle 20 has a configuration such that it jets the molten solder S from right to left in FIG. 6, which is a mirrored system of the jet nozzle 10 of the first embodiment shown in FIG. 2. The jet nozzle 20 may jet the molten solder S from left to right in FIG. 6, which is similar to the jet nozzle 10 of the first embodiment shown in FIG. 2. By setting a jetting direction of the jet nozzle 20 so that it is an opposite direction of the jet nozzle 10 according to the first embodiment, a position of the opening portion 43a in the upper surface of the duct 43 is also opposite to that of the first embodiment. However, the operation of the opening portion 43a is the same as that described in the first embodiment. Further, for the same reason, positions of the lids 46a, 46b, a position of the heater 8 connected to the lid 46a and a position of the opening portion 43a in the upper surface of the duct 43 are also opposite to those of the first embodiment. However, their operations are the same as those described in the first embodiment.

As shown in FIG. 7, the jet nozzle 20 can vary a width of the jetted molten solder S (by varying a width of the upper opening end 56A of a nozzle main body 25). The jet nozzle 20 contains the nozzle main body 25 having a rectangular upper opening end 56A through which the molten solder is jetted and a molten solder flow width varying member 26 that varies a width of the upper opening end 56A of the nozzle main body 25 by a slide of the molten solder flow width varying member 26 within the nozzle main body 25.

The nozzle main body 25 is attached onto the duct 43 by screws, not shown, or the like over the opening portion 43a of the upper surface 4b thereof, as shown in FIG. 6. The jet nozzle 20 may include an inclined plate 27 that returns the jetted molten solder S to the solder bath 4, a heater 8, shown in FIG. 3, that heats space within the lid 46b, and a plunger 9 that slides the molten solder flow width varying member 26.

The nozzle main body 25 has a rectangular hollow 51A at a bottom. The nozzle main body 25 has a base portion 52A assembled to be opposed to the soldering bath 4 as shown in FIG. 6. The nozzle main body 25 jets the molten solder S from the upper opening end 56A.

In this embodiment, a shape of the nozzle main body 25 is configured to be able to flow the molten solder S along a jetting direction of the molten solder S vertically jetted upward. As shown in FIG. 8A, the nozzle main body 25 contains a lower portion 53A that has a rectangular section and vertically extends from a base portion 52A, and a bending portion 54A that extends from the lower portion 53A to bend with roundness. The nozzle main body 25 contains a side wall 25b at a side surface which is opposite side of the plunger 9 (see FIG. 3). The side wall 5b is configured to be side walls of the lower portion 53A, the bending portion 54A, and a horizontal portion 55A which extends along the bending portion 54A, is further bent from the bending portion 54A and extends horizontally along the base portion 52A. The nozzle main body 25 has an upper opening end 56A at a forward end of the bending portion 54A. The nozzle main body 25 has an opening 57A at an opposite side of the side wall 25b to be configured as a channel section, as shown in FIG. 8B, for inserting the molten solder flow width varying member 26 thereinto.

In the upper opening end 56A at a forward end of the bending portion 54A, an outer portion 54a of the bending portion 54A extends longer than an inner portion 54b of the bending portion 54A along a jetting direction of the molten solder S (see an arrow direction shown in FIG. 8B). This enables the molten solder S to be guided to a side of the inner portion 54b to jet the molten solder S without leaking the molten solder S to a side of the outer portion 54a.

As shown in FIG. 8C, the molten solder flow width varying member 26 includes a molten solder flow width varying plate 61A that varies the width of the molten solder flow, a rectangular cubic rectifying piece 62A that is attached to the molten solder flow width varying plate 61A at an opposite side of the upper opening end 56A of the nozzle main body 25 and extends along a slide direction of the molten solder flow width varying member 26, and a sliding shaft 63A that slides the rectifying piece 62A.

As shown in FIG. 7, the molten solder flow width varying plate 61A is configured to be a plate having a slightly smaller size than that of the side wall 25b of the nozzle main body 25 and having a shape that is almost similar to that of the side wall 25b of the nozzle main body 25 because the molten solder flow width varying plate 61A is enclosed within the nozzle main body 25. The flow width varying surface plate 61A is configured to be extended from the base portion 52A of the nozzle main body 25 to the upper opening end 56A.

An upper surface 26a of the rectifying piece 62A has the same length and width as those of the upper opening end 56A. As shown in FIG. 8C, the rectifying piece 62A includes a rectifying upper portion 62a that vertically extends below the upper surface 26a and a rectifying lower portion 62b that extends from the rectifying upper portion 62a and is shorter than the rectifying upper portion 62a.

The rectifying piece 62A contains a cut-away portion 62c that is obliquely cut away from a side surface of the rectifying piece 62A at a side of the molten solder flow width varying plate 61A to the bottom 26b of the rectifying piece 62A. This cut-away portion 62c is configured to guide a flow of the molten solder S from the solder bath 4 shown in FIG. 6 to the upper opening end 56A through the base portion 52A of the jet nozzle 20 shown in FIG. 7.

The rectifying piece 62A has a stepwise shape 62d between a side surface from which the sliding shaft 63A extends and the bottom 26b of the rectifying piece 62A.

The molten solder flow width varying member 26 may include a reinforcing member 64A that is attached to an angle formed by the molten solder flow width varying plate 61A and the rectifying piece 62A. The reinforcing member 64A acts to reinforce the molten solder flow width varying plate 61A so that the molten solder flow width varying plate 61A cannot be deformed by pushing of the molten solder S. The reinforcing member 64A of this embodiment is configured to be an almost triangular thin plate and to be connected to the molten solder flow width varying plate 61A and the upper surface 26a of the rectifying piece 62A.

The sliding shaft 63A extends from the rectifying piece 62A along a sliding direction of the molten solder flow width varying member 26 on an opposite side of the molten solder flow width varying plate 61A. The sliding shaft 63A of this embodiment passes through a shaft-supporting member 63C, as shown in FIG. 7, and has a flange part 63b at a forward end of the sliding shaft 63A. The shaft-supporting member 63C includes a plate portion 63d with an opening 63c and a standing portion 63e standing from the upper surface 4b of the duct 43. The plate portion 63d connects the standing portion 63e and the standing portion 63e is fixed to the upper surface 4b by screws, not shown, or the like. The flange part 63b has the same configuration as that of the flange part 63a shown in FIG. 3, which has been described in the first embodiment, and is attached to the plunger 9 shown in FIG. 3.

As shown in FIGS. 7 through 8C, the molten solder flow width varying member 26 is assembled into the nozzle main body 25 from the opening 57Aa along a direction indicated by an arrow shown in FIG. 7 by horizontally positioning the molten solder flow width varying plate 61A, the rectifying piece 62A and the sliding shaft 63A and facing a forward end of the molten solder flow width varying plate 61A to a side of the upper opening end 56A of the nozzle main body 25.

As shown in FIG. 6, the inclined plate 27 may be mounted on the upper surface 4b of the duct 43 of the solder bath 4 by screws, not shown, or the like. As shown in FIG. 7, the inclined plate 27 has an inclination along a flowing direction of the molten solder S jetted from the upper opening end 56A of the nozzle main body 25. The inclined plate 27 includes two side walls vertically standing from the sides. The inclined plate 27 is installed so that the upper end of the inclined plate 7 is positioned below the upper opening end 56A of the nozzle main body 25. The inclined plate 7 shown in FIG. 3, which has been described in the first embodiment, may be used as the inclined plate 27. The inclined plate 27 can be formed easier than the inclined plate 7, so that costs for forming may be saved. The inclined plate 27 is provided for wakening force of the molten solder S jetted from the upper opening end 56A of the nozzle main body 25 by its inclined surface, which is similar to the above-mentioned inclined plate 7, and preventing oxide from occurring at a convergent position between the molten solder S jetted from the upper opening end 56A of the nozzle main body 25 and the molten solder S within the solder bath 4.

<Operation Examples of Jet Soldering Apparatus 2 and Jet Nozzle 20>

FIG. 9A shows a case where the molten solder flow width varying member 26 is assembled to the nozzle main body 25. This applies to a case where the soldering is performed on the region 3A or the like to be partially soldered of the printed circuit board 3 shown in FIG. 1 and corresponds to a state of the jet nozzle 20 shown in FIG. 12A. In this moment, the sliding shaft portion 91 of the plunger 9 shown in FIG. 3 projects from the plunger 9. FIG. 9B shows a case where the plunger 9 retracts the sliding shaft portion 91 to slide the molten solder flow width varying member 26 so that the molten solder flow with a broadened width as indicated by an arrow shown in FIG. 9B is jetted. This applies to a case where the soldering is performed on the region 3C or the like to be partially soldered of the printed circuit board 3 shown in FIG. 1 and corresponds to a state of the jet nozzle 20 shown in FIG. 12B.

The following will describe operation examples of the jet soldering apparatus 2 and the jet nozzle 20 when the width of the molten solder flow jetted from the jet nozzle 20 as shown in FIG. 9A is broadened to the width of the molten solder flow jetted from the jet nozzle 20 as shown in FIG. 9B and the soldering is performed on the region 3B to be partially soldered of the printed circuit board 3 shown in FIG. 1, with reference to FIGS. 1, 6 through 9B, 12A and 12B.

A user inputs a width and a position of the region 3B to be partially soldered of the printed circuit board 3 which a conveying mechanism 32 conveys using an input portion, not shown. In this moment, any conditions such as a width of the printed circuit board 3 and heating temperature of the molten solder S may be input. The control device 31 controls the plunger 9 shown in FIG. 3 to allow the sliding shaft portion 91 to retreat, corresponding to the input region 3B to be partially soldered of the printed circuit board 3. The flange portion 63b of the sliding shaft 63A (see FIG. 7) also retreats. The molten solder flow width varying member 26 then slides within the nozzle main body 25 along an arrow shown in FIG. 9A, so that the molten solder flow width varying member 26 moves away from the side wall 25b. This enables the width of the upper opening end 56A of the jet nozzle 20 to correspond to the width of the input region 3B to be partially soldered of the printed circuit board 3. The control device 31 controls the screw pump 47 shown in FIG. 6 to increase revolution number of the screw 47a thereof according to the broadened width of the molten solder flow, so that the control device 31 is configured to adjust an amount of the jetted molten solder S to be increased and make a height of the jetted molten solder S unchanged as compared with that before the width variation. This allows the height of the molten solder flow jetted from the upper opening end 56A of the nozzle main body 25 to be made even and constant so that it is possible to perform the even and constant soldering on the printed circuit board 3 regardless of the width of the upper opening end 56A. The operation of the supplying device 40 of the molten solder S is similar to that described above, the explanation of which will be omitted.

The molten solder S is then forcefully fed upward in the nozzle main body 25 and is bent downward along the bending portion 54A as indicated by an arrow shown in FIG. 8B so as to be jetted from the upper opening end 56A of the nozzle main body 25. As indicated by an arrow defined by outline as shown in FIG. 9B, the control device 31 controls the conveying mechanism 32 to convey the printed circuit board 3 along a direction that is the same as the jetting direction of the molten solder S from the upper opening end 56A of the nozzle main body 25 and horizontally over the upper opening end 56A of the nozzle main body 25. In other words, the conveying mechanism 32 conveys the printed circuit board 3 from a side of the outer portion 54a, which is shown in FIG. 8B, of the bending portion 54A. By contacting the molten solder S with the region 3B to be partially soldered of the printed circuit board 3 shown in FIG. 1 when the printed circuit board 3 passes through the position over the upper opening end 56A of the nozzle main body 25, the printed circuit board 3 is soldered. The printed circuit board 3 is conveyed to a side of the inner portion 54b.

More in detail, the control device 31 controls the conveying mechanism 32 to convey the printed circuit board 3 so that an end 3c of the region 3B to be partially soldered of the printed circuit board 3 is positioned at the position over the upper opening end 56A of the jet nozzle 20. By contacting the end 3c with the molten solder flow, the end 3c is soldered. When the control device 31 controls the conveying mechanism 32 to convey the printed circuit board 3 along the direction indicated by the arrow B2 shown in FIG. 1 and horizontally over the upper opening end 56A, a region to be soldered with the molten solder flow in the printed circuit board 3 is transferred sequentially to an opposite direction of the direction indicated by the arrow B2. When the other end 3d of the region 3B to be partially soldered of the printed circuit board 3 is positioned at the position over the upper opening end 56A and the end 3d is soldered, the soldering is completed.

The inclined plate 27 shown in FIG. 6 receives excess molten solder S which is jetted from the upper opening end 56A but is not adhered to the printed circuit board 3. The excess molten solder S is then returned from the inclined plate 27 to the solder bath 4. The molten solder S thus returned to the solder bath 4 is sent to the opening portion 44 of the housing 44a and circulated.

When it is insufficient to solder the region to be partially soldered of the printed circuit board 3 by passing through the printed circuit board 3 over the jet nozzle 20 only once because the region to be partially soldered of the printed circuit board 3 is too wide, the printed circuit board 3 is repeatedly conveyed over the jet nozzle 20 until the soldering is completed and is completely soldered.

According to the jet nozzle 20 of this embodiment, the rectifying piece 62A is thicker than that of the jet nozzle 10 or the jet soldering apparatus 1 of the first embodiment. The cut-away portion 62c provided in the rectifying piece 62A enables a flow of the molten solder S within the hollow MA of the nozzle main body 25 to be guided to one direction, which will be described later. According to the jet nozzle 20 of this embodiment, when varying the width of the jetted molten solder flow by sliding the molten solder flow width varying member 26 forward or backward based on the width and/or position of the region to be partially soldered of the printed circuit board 3, the molten solder S jetted from the upper opening end 56A of the jet nozzle 20 has the even and constant height (which is a jetted flow that is near a laminar flow). Accordingly, it is possible to perform the even and constant soldering regardless of the width of the upper opening end 56A of the jet nozzle 20.

<Comparison of Jetted Molten Solder S in Each Nozzle>

The following will describe comparison examples of the jetted molten solder S in the nozzle 30 of related art, the jet nozzle 10 of the first embodiment and the jet nozzle 20 of the second embodiment, with reference to FIGS. 10A through 12B. FIGS. 10A, 11A and 12A respectively show the examples of the jetted molten solder S with a width d1. FIGS. 10B, 11B and 12B respectively show the examples of the jetted molten solder S with a width d2 which is broader than the width d1. Arrows within each nozzle of each drawing indicate a direction of a flow of the molten solder S.

FIGS. 10A and 10B show a flow of the molten solder S when jetting the molten solder S using the nozzle 30 of related art. As shown in FIG. 10A, in a case of the width d1 of the molten solder S, when the molten solder S going up within the nozzle 30 is hit against a shatter 36, the molten solder S is rebound to become a downward flow. When this downward flow runs against an upward flow of the molten solder, a large turbulent flow (swirling current) occurs in the nozzle 30. The molten solder S jetted from the upper opening end of the nozzle 30 is influenced by this turbulent flow, so that the molten solder S is jetted with an uneven height. In FIG. 10B, the shatter 36 is moved from the state of FIG. 10A, so that the width of the upper opening end of the nozzle 30 is made broader so as to be the width d2. Making the width of the upper opening end of the nozzle 30 broader than that shown in FIG. 10A allows an area of the shatter 36 against which the molten solder S is hit to be smaller, thereby making the turbulent flow smaller. However, since the turbulent flow occurs in the nozzle 30 even if the width of the upper opening end of the nozzle 30 is the width d2, the occurrence of the turbulent flow is prevented as compared by a case where the width of the upper opening end of the nozzle 30 is the width d1 but the height of the molten solder S jetted from the upper opening end of the nozzle 30 is uneven.

FIGS. 11A and 11B show a flow of the molten solder S when jetting the molten solder S using the jet nozzle 10. As shown in FIG. 11A, in a case of the width d1 of the molten solder S, when the molten solder S going up within the jet nozzle 10 from the opening portion 43a of the solder bath 4 shown in FIG. 2 is hit against the molten solder flow width varying member 6, the molten solder S goes up around the molten solder flow width varying member 6. Since the molten solder S passes through a side of the molten solder flow width varying member 6 and goes up by a rectifying distance d3 to be rectified, the molten solder S is jetted with an even height, as compared by the case of the nozzle 30. In FIG. 11B, the molten solder flow width varying member 6 is moved from the state of FIG. 11A, so that the width of the upper opening end of the jet nozzle 10 is made broader so as to be the width d2. Making the width of the upper opening end of the jet nozzle 10 broader than that shown in FIG. 11A allows an amount of the molten solder S around the molten solder flow width varying member 6 to be smaller, thereby enabling the molten solder S to be supplied with the more even height.

FIGS. 12A and 12B show a flow of the molten solder S when jetting the molten solder S using the jet nozzle 20. As shown in FIG. 12A, in a case of the width d1 of the molten solder S, when the molten solder S goes up and enters within the jet nozzle 20 from the opening portion 43a of the solder bath 4 shown in FIG. 2. The width of the molten solder S entered within the jet nozzle 20 is varied from just above the opening portion 43a and the molten solder S entered within the jet nozzle 20 is guided by the cut-away portion 62c. The molten solder S is rectified while it goes up around the molten solder flow width varying member 26. The jet nozzle 20 is provided with the cut-away portion 62c and has a rectifying distance d4 of the molten solder S is set to be longer than the rectifying distance d3 of the molten solder S in the jet nozzle 10. Accordingly, the jet nozzle 20 can jet the molten solder S with more even height as compared by a case of the jet nozzle 10. In FIG. 12B, the molten solder flow width varying member 26 is moved from the state of FIG. 12A, so that the width of the upper opening end of the jet nozzle 20 is made broader so as to be the width d2. Even in this state, it is possible to jet and supply the molten solder S with the even height.

The molten solder flow width varying member 6 of the first embodiment may be provided with a cut-away portion like the cut-away portion 62c provided in the molten solder flow width varying member 26 of the second embodiment. In this case, the molten solder S becomes a more even upward flow toward the upper opening end 56 within the hollow 51A in the nozzle main body 25, as compared by a case of the molten solder S shown in FIGS. 11A and 11B This invention is very preferably applicable to a jet nozzle which jets the molten solder to a region to be partially soldered of the printed circuit board and a jet soldering apparatus using the jet nozzle.

It is to be noted that any technical scope of the claims and/or meaning of term(s) claimed in the claims are not limited to the description in the above-mentioned embodiments. It should be understood by those skilled in the art that various modifications, combinations, sub-combinations and alterations may occur depending on design requirements and other factors insofar as they are within the scope of the appended claims or the equivalents thereof.

What is claimed is:

1. A jet nozzle which allows a width of a flow of jetted molten solder to vary, the jet nozzle comprising:
    a nozzle main body having a rectangular channel section with both opening ends, the one opening end being opposed to a soldering bath and the other opening end jetting the molten solder flow; and
    a molten solder flow width varying member that varies a width of the other opening end of the nozzle main body by a slide of the molten solder flow width varying member, wherein the molten solder flow width varying member includes:
        a molten solder flow width varying plate that extends along a jetting direction of the molten solder;
        a rectangular rectifying piece that is attached to the molten solder flow width varying plate at an opposite side of the other opening end of the nozzle main body and extends along a slide direction of the molten solder flow width varying member; and
        a sliding shaft that slides the rectifying piece,
        wherein the rectifying piece contains a solder-guiding portion that is obliquely cut away from a side surface of the rectifying piece to a bottom thereof and guides the flow of the molten solder.

2. The jet nozzle according to claim 1, wherein the nozzle main body bends along the jetting direction of the molten solder jetted from the nozzle main body.

3. The jet nozzle according to claim 1, wherein the molten solder flow width varying member further includes a reinforcing member that is attached to an angle formed by the molten solder flow width varying plate and the rectifying piece.

4. The jet nozzle according to claim 1, wherein the jet nozzle further comprises a plunger that plunges the sliding shaft.

5. The jet nozzle according to claim 1, wherein the jet nozzle further comprises an inclined plate that has an inclination along a flowing direction of the molten solder jetted from the other opening end of the nozzle main body.

6. A jet soldering apparatus, comprising:
    a jet nozzle according to claim 1;
    a supplying device for supplying molten solder to the jet nozzle;
    a conveying device for conveying a printed circuit board horizontally along the other opening end of the nozzle main body; and
    a control device for varying a width of the molten solder flow from the jet nozzle so as to meet a width of the region to be partially soldered of the printed circuit board, adjusting an amount of the supplied molten solder so as to meet the varied width of the molten solder flow, contacting one end of the region to be partially soldered of the printed circuit board with the jetted molten solder, and conveying the printed circuit board by sequentially moving the contact thereof toward the other end of the region to be partially soldered of the printed circuit board.

7. A jet soldering apparatus, comprising:
    a jet nozzle according to claim 2;
    a supplying device for supplying molten solder to the jet nozzle;
    a conveying device for conveying a printed circuit board horizontally along the other opening end of the nozzle main body; and
    a control device for varying a width of the molten solder flow from the jet nozzle so as to meet a width of the region to be partially soldered of the printed circuit board, adjusting an amount of the supplied molten solder so as to meet the varied width of the molten solder flow, contacting one end of the region to be partially soldered of the printed circuit board with the jetted molten solder, and conveying the printed circuit board by sequentially moving the contact thereof toward the other end of the region to be partially soldered of the printed circuit board.

8. A jet soldering apparatus, comprising:
    a jet nozzle according to claim 3;
    a supplying device for supplying molten solder to the jet nozzle;
    a conveying device for conveying a printed circuit board horizontally along the other opening end of the nozzle main body; and
    a control device for varying a width of the molten solder flow from the jet nozzle so as to meet a width of the region to be partially soldered of the printed circuit board, adjusting an amount of the supplied molten solder so as to meet the varied width of the molten solder flow, contacting one end of the region to be partially soldered of the printed circuit board with the jetted molten solder, and conveying the printed circuit board by sequentially moving the contact thereof toward the other end of the region to be partially soldered of the printed circuit board.

9. A jet soldering apparatus, comprising:
    a jet nozzle according to claim 4;
    a supplying device for supplying molten solder to the jet nozzle;
    a conveying device for conveying a printed circuit board horizontally along the other opening end of the nozzle main body; and
    a control device for varying a width of the molten solder flow from the jet nozzle so as to meet a width of the region to be partially soldered of the printed circuit board, adjusting an amount of the supplied molten solder so as to meet the varied width of the molten solder flow, contacting one end of the region to be partially soldered of the printed circuit board with the jetted molten solder, and conveying the printed circuit board by sequentially moving the contact thereof toward the other end of the region to be partially soldered of the printed circuit board.

10. A jet soldering apparatus, comprising:
a jet nozzle according to claim 5;
a supplying device for supplying molten solder to the jet nozzle;
a conveying device for conveying a printed circuit board horizontally along the other opening end of the nozzle main body; and
a control device for varying a width of the molten solder flow from the jet nozzle so as to meet a width of the region to be partially soldered of the printed circuit board, adjusting an amount of the supplied molten solder so as to meet the varied width of the molten solder flow, contacting one end of the region to be partially soldered of the printed circuit board with the jetted molten solder, and conveying the printed circuit board by sequentially moving the contact thereof toward the other end of the region to be partially soldered of the printed circuit board.

11. The jet soldering apparatus according to claim 6, wherein the control device controls the conveying device to convey the printed circuit board toward the same direction as the jetting direction of the molten solder jetted from the other opening end of the nozzle main body.

12. The jet soldering apparatus according to claim 7, wherein the control device controls the conveying device to convey the printed circuit board toward the same direction as the jetting direction of the molten solder jetted from the other opening end of the nozzle main body.

13. The jet soldering apparatus according to claim 8, wherein the control device controls the conveying device to convey the printed circuit board toward the same direction as the jetting direction of the molten solder jetted from the other opening end of the nozzle main body.

14. The jet soldering apparatus according to claim 9, wherein the control device controls the conveying device to convey the printed circuit board toward the same direction as the jetting direction of the molten solder jetted from the other opening end of the nozzle main body.

15. The jet soldering apparatus according to claim 10, wherein the control device controls the conveying device to convey the printed circuit board toward the same direction as the jetting direction of the molten solder jetted from the other opening end of the nozzle main body.

* * * * *